(12) United States Patent
Iwata

(10) Patent No.: US 7,436,731 B2
(45) Date of Patent: Oct. 14, 2008

(54) SEMICONDUCTOR DEVICE AND METHOD FOR DRIVING THE SAME

(75) Inventor: Syusuke Iwata, Hyogo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 258 days.

(21) Appl. No.: 11/459,779

(22) Filed: Jul. 25, 2006

(65) Prior Publication Data

US 2007/0036018 A1 Feb. 15, 2007

(30) Foreign Application Priority Data

Jul. 29, 2005 (JP) ............................... 2005-220530

(51) Int. Cl.
*G11C 5/14* (2006.01)
(52) U.S. Cl. .............. 365/226; 365/189.05; 365/189.09
(58) Field of Classification Search ................. 365/226, 365/189.05, 189.09, 156, 230.05
See application file for complete search history.

(56) References Cited

U.S. PATENT DOCUMENTS

| | | | |
|---|---|---|---|
| 4,964,084 A | 10/1990 | Jung et al. | |
| 5,602,792 A | 2/1997 | Kanaishi | |
| 5,663,905 A | 9/1997 | Matsuo et al. | |
| 5,777,926 A | 7/1998 | Trinh et al. | |
| 5,870,331 A | 2/1999 | Hwang et al. | |
| 5,949,706 A | 9/1999 | Chang et al. | |
| 6,011,711 A | 1/2000 | Hodges et al. | |
| 6,046,942 A | 4/2000 | Hwang et al. | |
| 6,262,932 B1 | 7/2001 | Nguyen | |
| 6,385,081 B1 | 5/2002 | Shiomi | |
| 6,608,780 B2 | 8/2003 | Shau | |
| 6,972,987 B1 | 12/2005 | Wong et al. | |
| 2004/0105299 A1 | 6/2004 | Joshi | |
| 2004/0246805 A1* | 12/2004 | Nii ............................. | 365/226 |
| 2005/0002215 A1* | 1/2005 | Morishima .................. | 365/120 |
| 2005/0063232 A1 | 3/2005 | Chan et al. | |
| 2006/0215465 A1* | 9/2006 | Bhavnagarwala et al. ...................... | 365/189.12 |

FOREIGN PATENT DOCUMENTS

| | | |
|---|---|---|
| JP | 10-106267 | 4/1998 |
| JP | 2005-044142 | 2/2005 |
| WO | WO01-20612 | 3/2001 |

OTHER PUBLICATIONS

European Search Report (Application No. 06015504.1), dated Apr. 19, 2007 in English (7 pages).

* cited by examiner

*Primary Examiner*—Richard T. Elms
*Assistant Examiner*—Toan Le
(74) *Attorney, Agent, or Firm*—Fish & Richardson P.C.

(57) ABSTRACT

As operations of an SRAM, there are writing and reading operations, and only a portion of the whole memory operates during performing these operations, while another portion thereof stores a value. By lowering a current consumed in a period of storing this value, a semiconductor device with low power consumption is provided. The present invention provides a semiconductor device with reduced drive voltage in a period of storing a value, compared with a period of writing a value or a period of reading a value. Such a semiconductor device includes a power supply control circuit including an OR circuit electrically connected to a word line, an inverter circuit electrically connected to the OR circuit, and a transistor electrically connected to the OR circuit and the inverter circuit.

24 Claims, 11 Drawing Sheets

SEMICONDUCTOR DEVICE AND METHOD FOR DRIVING THE SAME

BACKGROUND OF THE INVENTION

1. Field of the Invention

The present invention relates to a semiconductor device including a memory element and a driving method of the semiconductor device.

2. Description of the Related Art

With miniaturization of a wiring by development of LSI (Large Scale Integration) manufacturing techniques, a problem of a leak current has become significant. The leak current causes problems such as heat of the LSIs or increase of power consumption. In particular, a problem of power consumption directly affects a continuous operating time of portable devices such as mobile phones and notebook personal computers, which becomes a serious problem. Therefore, various kinds of techniques are suggested for lowering power consumption of the LSIs.

For example, as the operation of LSIs, there are cases where the maximum performance is required or not. When the operating speed of the LSIs is not required to be very high, there is a technique in which a frequency of a clock is reduced to operate the LSIs. Similarly, when the maximum operating speed is not required, there is a technique in which a substrate bias is shifted and the threshold is controlled, so that a leak current is reduced.

In addition, a very high-capacity memory such as a cache is provided inside recent LSIs, and the LSIs are often composed of an SRAM (Static Random Access Memory). The SRAM stores a value by connecting inverter circuits to each other. An electric state is not changed once a value is stored; however, a leak current flows out of a power supply line which is electrically connected to the inverter circuit into a ground line.

As a configuration of an SRAM of which power consumption is reduced, a switching MOS transistor is provided between a power supply line of a memory cell group which is selected by each word line of a row decoder of the SRAM and a power supply line of a voltage supply source side, and the switching MOS transistor is opened or closed by a selection signal from the word line (Reference 1: Japanese Patent Laid-Open No. Hei 10-106267).

SUMMARY OF THE INVENTION

An operation of an SRAM includes writing and reading. Only a portion of the whole memory operates during performing this operation, and another portion thereof stores a value. A predetermined voltage is required for the operation of writing or reading; however, the predetermined voltage is not required for the operation of storing a value, and an off-current can be reduced by lowering a power supply voltage.

The SRAM disclosed in Patent Document 1 describes a structure where power of an address is changed to cut the power. However, when the power is cut, electricity flows into the ground line by the off-current of a transistor applied to the SRAM, and storing a value is considered difficult.

Thus, in the present invention, a power supply method is controlled in a memory by a method that is different from that in Patent Document 1 at the time of operating the LSI, and power consumption of the LSI is suppressed by reducing the leak current of the transistor.

In view of the aforementioned problem, it is an object of the present invention to reduce a drive voltage in a period of storing a value compared with a period of writing a value or a period of reading a value. That is, a first voltage is supplied to a power supply line of a memory cell in a period of writing the value in the memory cell in accordance with the present invention, while a second voltage lower than the first voltage is supplied to the power supply line of the memory cell in a period of storing the written value.

Specific structures of the present invention are shown below.

One mode of the present invention is a semiconductor device including a memory cell including an inverter circuit electrically connected to a power supply line, in which a first voltage is supplied to the power supply line in a period of writing a value to the memory cell. A second voltage lower than the first voltage is supplied to the power supply line in a period of storing the value written into the memory cell. The first voltage is supplied to the power supply line in a period of reading the value written into the memory cell.

Another mode of the present invention is a semiconductor device including a power supply control circuit and a memory cell. The power supply control circuit includes a first word line; a second word line; a circuit including one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals; a first inverter circuit having an input terminal electrically connected to the output terminal of the circuit; and a means for supplying a first voltage or a second voltage lower than the first voltage to the memory cell, the means being electrically connected to the circuit and the first inverter circuit. The memory cell includes a second inverter circuit, and is electrically connected to the first word line and the second word line.

Another mode of the present invention is a semiconductor device including a power supply control circuit and a memory cell. The power supply control circuit includes a first word line; a second word line; and a circuit including one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals; a first inverter circuit having an input terminal electrically connected to the output terminal of the circuit; and a means for supplying a first voltage or a second voltage lower than the first voltage to the memory cell, the means being electrically connected to the circuit and the first inverter circuit. The memory cell includes a second inverter circuit electrically connected to a ground line and a power supply line, and is electrically connected to the first word line and the second word line.

Another mode of the present invention is a semiconductor device including a power supply control circuit and a memory cell. The power supply control circuit includes a first word line; a second word line; a circuit including one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals; a first inverter circuit having an input terminal electrically connected to the output terminal of the circuit; and a means for supplying a first voltage or a second voltage lower than the first voltage to the memory cell, the means being electrically connected to the circuit and the first inverter circuit. The memory cell includes a second inverter circuit electrically connected to a ground line and a power supply line, and a transistor electrically connected to the second inverter circuit, which is electrically connected to the second word line and the first word line which is electrically connected to a gate electrode of the transistor.

Another mode of the present invention is a semiconductor device including a power supply control circuit and a memory cell. The power supply control circuit includes a first word line; a second word line; a circuit including one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals; a first inverter circuit having an input terminal electrically connected to the output terminal of the circuit; and a means for supplying a first voltage or a second voltage lower than the first voltage to the memory cell, the means being electrically connected to the circuit and the first inverter circuit. The memory cell includes a second inverter circuit electrically connected to a ground line and a power supply line; first to third transistors each electrically connected to the second inverter circuit; the first word line electrically connected to a gate electrode of the first transistor; and a data line electrically connected to one of either a source electrode or a drain electrode of each of the second transistor and the third transistor. The semiconductor device is electrically connected to the first word line and the second word line which is electrically connected to gate electrodes of the second transistor and the third transistor.

In the present invention, the means for supplying the first voltage or the second voltage lower than the first voltage to the memory cell includes two transistors.

In the present invention, the circuit including two input terminals and one output terminal, in which a HIGH level is outputted when a HIGH level is inputted to either one of the input terminals, and a LOW level is outputted when a LOW level is inputted to both of the input terminals, which includes an OR circuit, a circuit including a NOR circuit and an inverter circuit, or two inverter circuits and a NAND circuit.

In the present invention, the word line and the power supply line can be provided in the same layer as the gate electrode of a thin film transistor.

In the present invention, the data line can be formed of the same material as a source electrode and a drain electrode of the thin film transistor.

Another mode of the present invention is a driving method of a semiconductor device including a memory cell electrically connected to a first word line and a second word line, and including a first inverter circuit, and a power supply control circuit. The power supply control circuit includes the first word line, the second word line, a circuit including one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals, a second inverter circuit having an input terminal electrically connected to the output terminal of the circuit, a first transistor having a gate electrode electrically connected to an output terminal of the second inverter circuit, a second transistor electrically connected to the output terminal of the circuit, and a power supply line electrically connected to the first transistor and the second transistor. The first word line is at a HIGH level and the second word line is at a LOW level, so that the first transistor is turned ON, and a first voltage is supplied to the power supply line in a period of writing a value into the memory cell. The first word line and the second word line are at a LOW level, so that the second transistor is turned ON, and a second voltage lower than the first voltage is supplied to the power supply line in a period of storing the value written into the memory cell.

Another mode of the present invention is a driving method of a semiconductor device including a memory cell including a first inverter circuit electrically connected to a ground line and a power supply line, and is electrically connected to a first word line and a second word line; and a power supply control circuit including the first word line, the second word line, a circuit including one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals, a second inverter circuit having an input terminal electrically connected to the output terminal of the circuit, and a means for supplying a first voltage or a second voltage lower than the first voltage to the memory cell, the means being electrically connected to the circuit and the second inverter circuit The first word line is at a HIGH level and the second word line is at a LOW level, so that the first transistor is turned ON, and the first voltage is supplied to the power supply line in a period of writing a value into the memory cell. The first word line and the second word line are at a LOW level, so that the second transistor is turned ON, and the second voltage lower than the first voltage is supplied to the power supply line in a period of storing the value written into the memory cell.

Another mode of the present invention is a driving method of a semiconductor device including a memory cell electrically connected to a first word line and a second word line, and including a first inverter circuit, and a power supply control circuit. The power supply control circuit includes the first word line, the second word line, a circuit including one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals, a second inverter circuit having an input terminal electrically connected to the output terminal of the circuit, a first transistor having a gate electrode electrically connected to an output terminal of the second inverter circuit, a second transistor electrically connected to the output terminal of the circuit, and a power supply line electrically connected to the first transistor and the second transistor. The first word line is at a HIGH level and the second word line is at a LOW level, so that the first transistor is turned ON, and a first voltage is supplied to the power supply line electrically connected to the first transistor in a period of writing a value into the memory cell. The first word line and the second word line are at a LOW level, so that the second transistor is turned ON, and a voltage lower than the first voltage is supplied to the power supply line in a period of storing the value written into the memory cell. The first word line is at a LOW level and the second word line is at a HIGH level, so that the first transistor is turned ON, and the first voltage is supplied to the power supply line electrically connected to the first transistor in a period of reading the value written into the memory cell.

Another mode of the present invention is a driving method of a semiconductor device including a memory cell including a first inverter circuit electrically connected to a ground line and a power supply line, and is electrically connected to a first word line and a second word line; and a power supply control circuit. The power supply control circuit includes the first word line, the second word line, a circuit including one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals, a second inverter circuit having an input terminal electrically connected to the output terminal of the circuit, and a means for supplying a first voltage or a second voltage lower than the first voltage to the memory cell, the means being electrically connected to the circuit and the first inverter circuit. The first word line is at a HIGH level and the second word line is at a LOW level, so that the first transistor is turned ON, and the first voltage is supplied to the power supply line electrically connected to the first transistor in a period of writing a value into the memory cell. The first word line and the second word line are at a LOW level, so that the second transistor is turned ON, and a voltage lower than the first voltage is supplied to the power supply line in a period of storing the value written into the memory cell. The first word line is at a LOW level and the second word line is at a HIGH level, so that the first transistor is turned ON, and the first voltage is supplied to the power supply line electrically connected to the first transistor in a period of reading the value written into the memory cell.

By the present invention, low power consumption of a semiconductor device provided with a memory can be achieved. In particular, as a function of the LSI becomes complex, the capacity of a memory required for the LSI also increases, and a ratio of an area of the memory to a chip also increases. As the capacity of the memory increases, the ratio of an area of a memory cell, which requires a predetermined voltage, to the whole SRAM decreases, so that the advantageous effect of the invention is increased.

DETAILED DESCRIPTION OF THE INVENTION

Embodiment Mode

Figure 1:
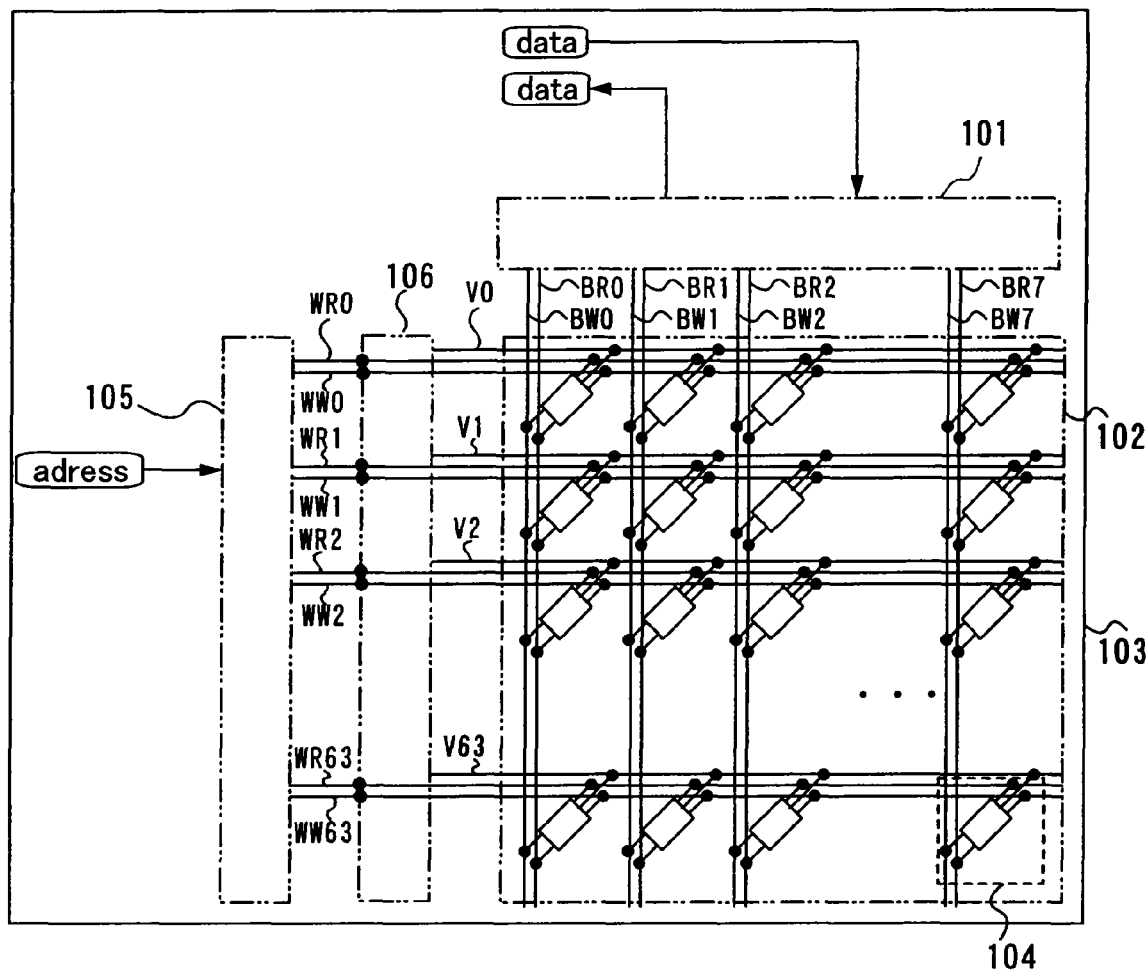
FIG. 1 is a diagram showing a configuration of an SRAM memory of the present invention.

A semiconductor device in accordance with the present invention includes a memory cell array in which a plurality of memory cells is arranged, a read circuit for controlling a bit line which performs writing and reading, and an address decoder for controlling a word line. Further, a power supply control circuit is provided between the address decoder and the memory cell array. When a signal is outputted from the address decoder to the word line, the power supply control circuit controls a power supply line which is extended to the memory cell array and electrically connected to the memory cell in synchronization with the signal. At this time, a predetermined power supply voltage is applied to the power supply line.

The memory cell is formed to have a structure in which inverter circuits are electrically connected in series. Specifically, two inverter circuits are provided such that an output terminal of one inverter circuit is electrically connected to an input terminal of the other inverter circuit, and an input terminal of one inverter circuit is electrically connected to an output terminal of the other inverter. That is, a static RAM is formed.

A power supply control circuit includes at least two word lines; a circuit including one output terminal, and two input terminals which are electrically connected to the respective word lines, which outputs a HIGH level when a HIGH level is inputted to either one of the input terminals, and outputs a LOW level when a LOW level is inputted to both of the input terminals; an inverter circuit electrically connected to the circuit; and a means which is electrically connected to the circuit and the inverter circuit, which applies a first voltage or a second voltage lower than the first voltage to a memory cell. Two transistors electrically connected in series can be used as the means which applies the first voltage or the second voltage lower than the first voltage to the memory cell. The first voltage is supplied when writing/reading a value to/from the memory cell, while the second voltage is supplied when storing the value. Accordingly, compared with a period of writing the value or a period of reading the value, a drive voltage in a period of storing the value can be lowered and low power consumption of the memory cell can be achieved.

Such a memory array can be employed as a CPU (Central Processing Unit) or a cache memory of an MPU (Microprocessor). By applying the memory array to a CPU or an MPU, low power consumption of the CPU or the MPU can be achieved.

Embodiments of the present invention are described with reference to the drawings below. It is to be understood that various changes and modifications will be apparent to those skilled in the art. Therefore, unless such changes and modifications depart from the scope of the present invention, they should be construed as being included therein. Note that the same reference numeral is used to denote the same portion or a portion having a similar function among diagrams for illustrating the embodiments, and repetitive description is omitted.

A voltage value in embodiments shown below is one example, and the present invention is not limited to this value.

Embodiment 1

In this embodiment, a configuration of an SRAM memory of the present invention is described. In addition, a device including a semiconductor element such as an SRAM memory of the present invention can be called a semiconductor device.

FIG. 1 shows an example of a configuration of an SRAM memory of the present invention. A memory 103 is a byte address memory and includes addresses of from 0 to 63. The memory 103 has a structure in which 8-bit memory cells are provided in a horizontal direction and 64 lines of from an address 0 to an address 63 are provided in a vertical direction.

A memory cell 104 can store a value of 1 bit, and a memory cell array 102 includes the memory cells 104 of 8 bits×64 lines.

A write/read circuit 101 writes data from the outside of the memory to the memory cell array 102, reads data from the memory cell array 102, and transmits the data to the outside of the memory.

An address decoder 105 decodes a 6-bit address from the outside of the memory to be inputted into 64 word lines.

The address decoder 105 outputs a signal to word lines WR0 to WR63 or WW0 to WW63, and the signal is inputted to a power supply control circuit 106 to control power supply lines V0 to V63 of the memory cell array 102. A predetermined power supply voltage is applied to the power supply lines.

The word lines WR0 to WR63 can function as word lines for reading and WW0 to WW63 can function as word lines for writing with an output signal from the address decoder 105. That is, one of WW0 to WW63 is in a state of a high-potential side (hereinafter referred to as "a HIGH level") at the time of writing, while one of WR0 to WR63 is at a HIGH level at the time of reading. For example, only WR0 is at a HIGH level in the case where of reading a value from the address 00, while only WW63 is at a HIGH level in the case of writing a value into the address 63.

BR0 to BR7 are bit lines for reading and BW0 to BW7 are bit lines for writing. At the time of reading, values of memory cells of 8 bits selected by an address are inputted to BR0 to BR7. At the time of writing, data from the outside is inputted to BW0 to BW7.

By such an SRAM memory, data of 8 bits×64=512 bits can be stored.

Next, a configuration example of the memory cell 104 is shown. Note that in this embodiment, description is made of the case where 5 V is supplied as a power supply voltage in a reading period and a writing period, and 3 V is supplied as a power supply voltage in a storing period. However, the present invention is not limited to these values.

Figure 2:
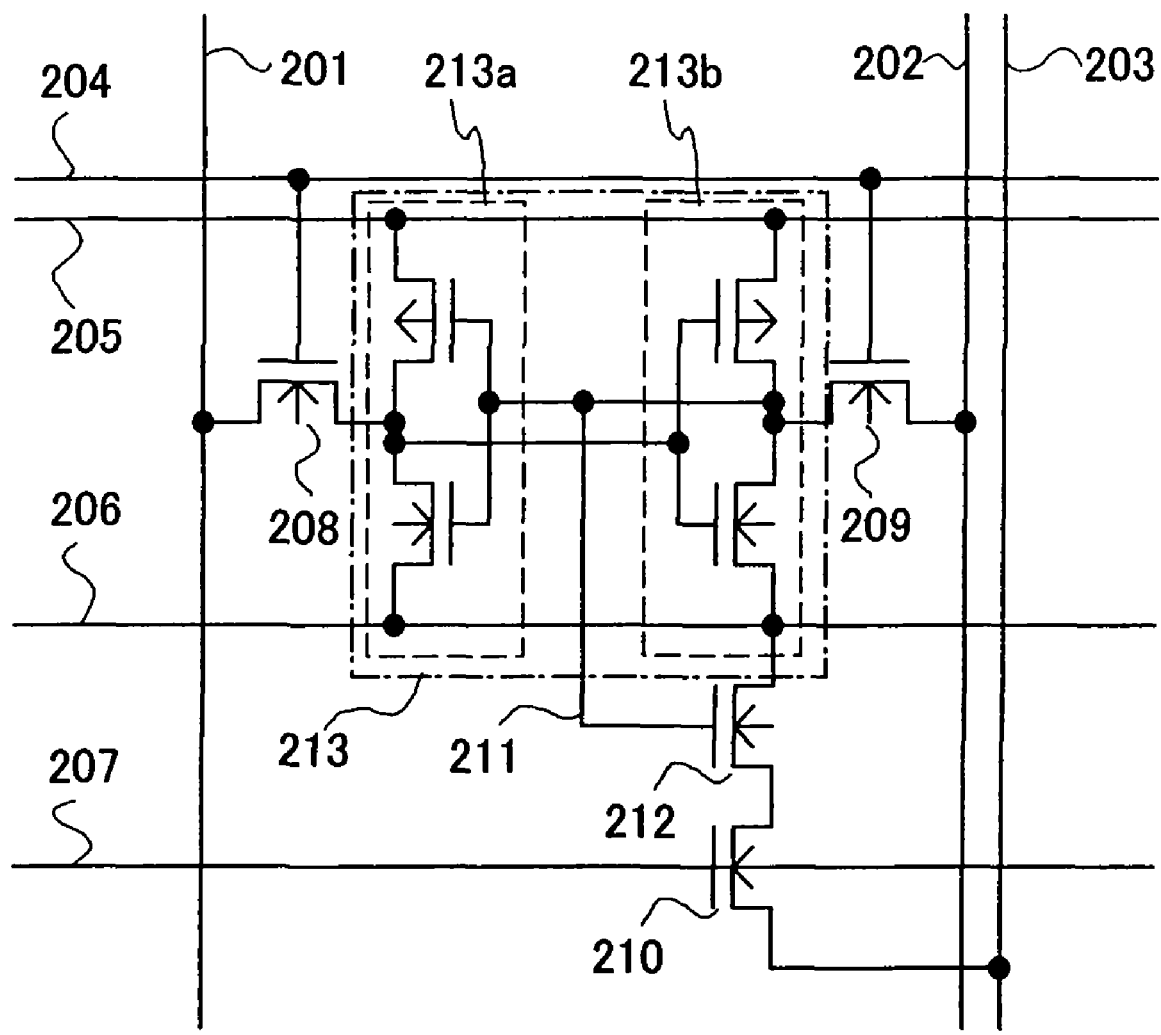
FIG. 2 is a circuit diagram showing a configuration of a memory cell of the present invention.

The memory cell 104 shown in FIG. 2 includes data lines 201 and 202 for writing, a data line 203, a word line 204 for writing, a power supply line 205, a ground line 206, a word line 207 for reading, N-channel transistors 208, 209, 210, and 212, a node 211, and an inverter circuit 213.

The inverter circuit 213 includes two inverter circuits 213a and 213b. An input terminal of the inverter circuit 213a is electrically connected to an output terminal of the inverter circuit 213b, while an output terminal of the inverter circuit 213a is electrically connected to an input terminal of the inverter circuit 213b. One electrode of the inverter circuit 213a and one electrode of the inverter circuit 213b included in the inverter circuit 213 are electrically connected to the power supply line 205. The other electrode of the inverter circuit 213a and the other electrode of the inverter circuit 213b are electrically connected to the ground line 206. A gate electrode of the transistor 208 and a gate electrode of the transistor 209 are electrically connected to the word line 204. One of either a source electrode or a drain electrode of the transistor 208 is electrically connected to the data line 201, while the other of either the source electrode or the drain electrode thereof is electrically connected to an output terminal of the inverter circuit 213a in the inverter circuit 213. The gate electrode of the transistor 209 is electrically connected to the word line 204, one of either a source electrode or a drain electrode thereof is electrically connected to the data line 202, and the other of either the source electrode or the drain electrode thereof is electrically connected to an output terminal of the inverter circuit 213b in the inverter circuit 213. A gate electrode of the transistor 212 is electrically connected to the node 211, one of either a source electrode or a drain electrode thereof is electrically connected to the ground line 206, and the other of either the source electrode or the drain electrode thereof is electrically connected to one of either a source electrode or a drain electrode of the transistor 210. A gate electrode of the transistor 210 is electrically connected to the word line 207, and the other of either the source electrode or the drain electrode thereof is electrically connected to the data line 203.

A normal value which is a writing value is inputted to the data line 201 for writing, while an inverted value is inputted to the data line 202 for writing. In the period other than the reading time, a normal value is written into the data line 203 for reading when the memory cell stores 1, while an inverted value is written into the data line 203 for reading when the memory cell stores 0, so that 5 V is precharged in the data line 203 by the read circuit 101.

At the time of writing, the word line 204 has 5 V and the transistors 208 and 209 are turned ON, so that a value can be written into the memory cell.

At the time of reading, the word line 207 is at a HIGH level and the transistor 210 is turned ON. In the case where the value of the memory cell is 0, a voltage of the node 211 has 5 V and the transistor 212 is turned ON, so that a voltage of the data line 203 which has been precharged is set as 0 V by the transistors 210 and 212. In the case where the value of the memory cell is 1, the transistor 212 is not turned ON so that the data line 203 is kept unchanged as 5 V since it has been precharged.

In this manner, the memory cell requires the same voltage as the overall power supply voltage of a device at the time of reading or writing. However, a value is stored in a state that only an inverter circuit is electrically separated from an LSI system in the period of storing a written value other than writing or reading. That is, in the period of storing a value, there is no exchange of a signal with the outside of the memory cell, and two inverter circuits in the inverter circuit 213 are only required to be operated. When a value is written into the memory cell once, two transistors among the four transistors in the inverter circuit 213 are turned ON and the other two transistors are turned OFF. The magnitude of a leak current of the memory cell, which flows from the power supply line 205 to the ground line 206, is determined with the two transistors in the OFF state. Although a voltage of 5 V is supplied to a conventional memory cell in the period of storing a value, a voltage of 3 V is supplied in the present invention in the period of storing a value. The leak current of the transistor in the OFF state is smaller by decreasing the power supply voltage. Accordingly, low power consumption of a memory element can be achieved. The power supply control circuit 106 is provided in order to perform such an operation.

Figure 3:
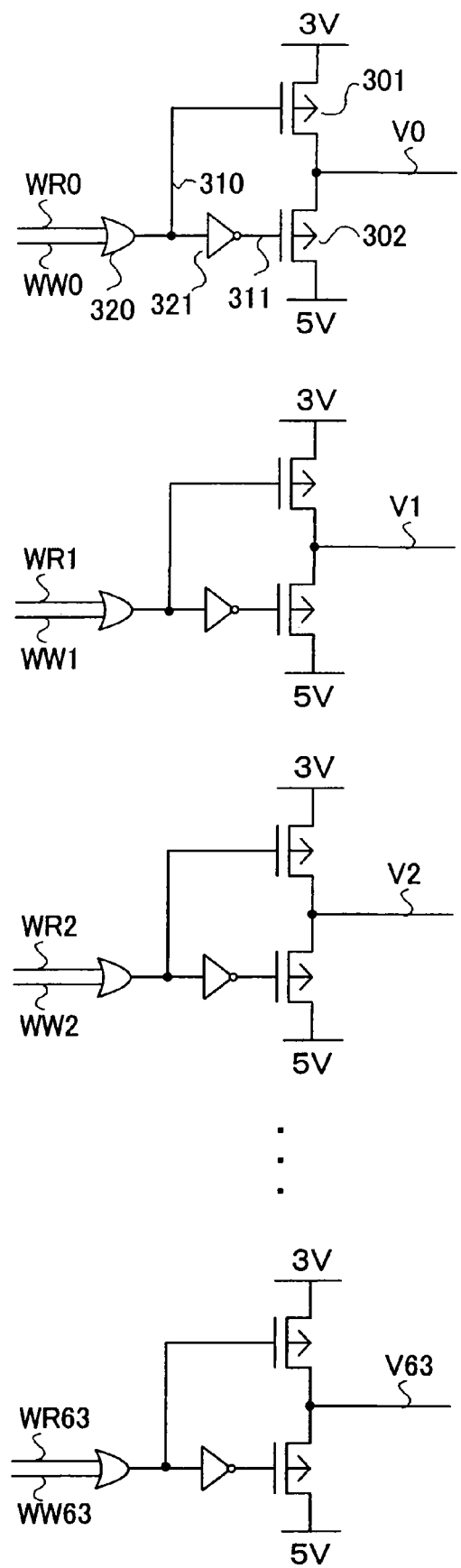
FIG. 3 is a circuit diagram showing a configuration of a power supply control circuit of the present invention.

Next, a configuration example of the power supply control circuit 106 and an operation thereof are shown. The power supply control circuit 106 includes an OR circuit 320, an inverter circuit 321, P-channel transistors 301 and 302, the word lines WR0 to WR63, and WW0 to WW63 as shown in FIG. 3. A NOR circuit and an inverter circuit, or two inverter circuits and a NAND circuit can be used as a substitute for the OR circuit 320. That is, a circuit, including two input terminals and one output terminal and having a function in which a HIGH level is outputted when a signal on a high-potential side is inputted to either of the input terminals, while a signal on a low-potential side (hereinafter referred to as "a LOW level") is outputted when a LOW level is inputted to both of the input terminals, may be used. Note that here, one input terminal is electrically connected to the word line WR0, the other input terminal is electrically connected to the word line WW0, and the output terminal is electrically connected to the input terminal of the inverter circuit.

The input terminals of the OR circuit 320 are electrically connected to the word lines WR0 to WR63 and WW0 to WW63, while the output terminal thereof is electrically connected to a gate electrode of the transistor 301 and an input terminal of the inverter circuit 321. An output terminal of the inverter circuit 321 is electrically connected to a gate electrode of the transistor 302. One of either a source electrode or a drain electrode of the transistor 301 and one of either a source electrode or a drain electrode of the transistor 302 are electrically connected to each other, which are also electrically connected to a power supply line V0.

In such a power supply control circuit 106, an output from the word line of the address decoder 105 is used as an input, and the word lines WR and WW are used as the input terminals of the OR circuit. A power supply voltage of 5 V is supplied to the power supply lines at the time when a corresponding address is at the time of reading or writing, and 3 V is supplied at the time other than that by an output of the OR circuit. For example, since WR0 is 1, a node 311 is at a LOW level, and a node 310 is at a HIGH level at the time of reading a value from the address 00, the transistor 302 is turned ON, and 5 V is supplied to the power supply line V0. As for a power supply voltage of other addresses, the transistor 301 electrically connected to 3 V is turned ON, and 3 V is supplied to V1 to V63. That is, for example, in a period of writing a value to the memory cell, the word line WR0 is at a HIGH level, the word line WW0 is at a LOW level, the transistor 302 is turned ON, and a first voltage is supplied to a power supply line electrically connected to the transistor 302. Then, in a period of storing a value written into the memory cell, the word line WR0 and the word line WW0 are at a LOW level, the transistor 301 is turned ON, and a voltage lower than the first voltage is supplied to the power supply line. Then, in a period of reading the value written into the memory cell, the word line WR0 is at a LOW level, the word line WW0 is at a HIGH level, the transistor 302 is turned ON, and the first voltage is supplied to the power supply line electrically connected to the transistor 302. Here, the transistors 301 and 302 correspond to a means for supplying the first voltage or the second voltage lower than the first voltage to the memory cell.

In this manner, by using the present invention, a voltage of 3 V is supplied in the period of storing a value, so that low power consumption of a memory element can be achieved compared with a conventional memory cell to which a voltage of 5 V is supplied in the period of storing a value. That is, by the present invention, the voltage supplied to the power supply line in the period of storing the value can be lowered compared with the voltage supplied to the power supply line in the period of writing or reading a value, so that low power consumption of the memory cell can be achieved.

Embodiment 2

In this embodiment, an operation of the SRAM memory of the present invention in the case of Embodiment 1 is described with reference to a timing chart.

Figure 4:
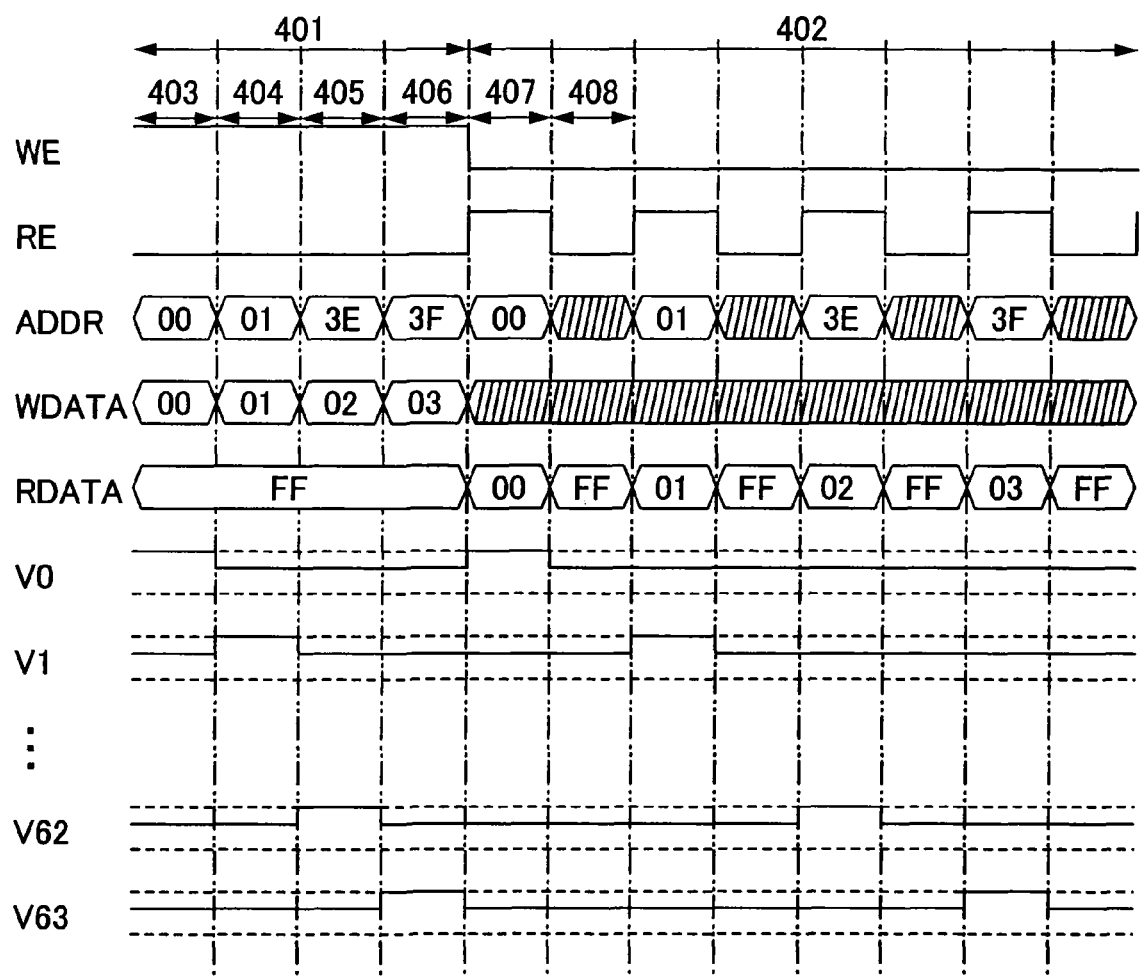
FIG. 4 is a timing chart of an SRAM memory of the present invention.

FIG. 4 shows a timing chart of the SRAM memory of the present invention. A signal of the SRAM of the present invention includes a signal for showing a writing period: WE (write enable), a signal for showing a reading period: RE (read enable), a signal of a data bus written into the SRAM in the writing period: WDATA (write data), a signal of a data bus for reading the data of the SRAM in the reading period: RDATA (read data), a signal of an address bus for performing writing or reading: ADDR (read or write address), and signals to be inputted to the power supply lines V0 to V63. At the time when WE is 1, it is determined that the memory is in a writing period, and an operation of writing the data written from the outside into an address line is performed. At the time when WE is 0, writing is not performed.

WE is at a HIGH level when a value is written into the SRAM, and WE is at a LOW level in the period other than that. RE is at a HIGH level when a value is read from the SRAM, and RE is at a LOW level in the period other than that. In addition, RE can be used for the timing of precharging the data line 203 of FIG. 2, and the data line 203 is precharged by the write/read circuit 101 at timing other than that of reading.

WDATA is an 8-bit bus, and inputted with a value written into the SRAM at the time of writing. RDATA is an 8-bit bus, and inputted with a value read from the SRAM at the time of reading. ADDR is a 6-bit bus, and inputted with an address to be written or read. The inputted address is decoded into a signal to be inputted a 64-bit reading word line or a 64-bit writing word line by the decoder 105. Pulse signals shown as the power supply lines V0 to V63 are the power supply voltages supplied to the addresses 0 to 63 respectively.

A period 401 is a period when WE is at a HIGH level and writing to the SRAM is performed, and a period 402 is a period when RE is at a HIGH level and reading is performed.

In a period 403, data 00 inputted to the WDATA bus is written into the address 00 inputted to the ADDR bus. At this time, a voltage of the power supply line V0 supplied to the address 00 is 5 V, and voltages of the power supply lines V1 to V63 of the addresses other than that are 3 V. Similarly, a period 404 is a period of writing data to the address 01, 5 V is supplied only to the power supply line V1 supplied to the memory cell of the address 01, and 3 V is supplied to the other power supply lines V0, and V2 to V63. Similarly, in a period 405 and a period 406, 5 V is supplied only to the power supply lines V62 and V63 of the address 62 and the address 63 respectively, and 3 V is supplied to the other addresses.

In a period 407, data is read from the address 00 which is inputted to the ADDR bus, and its value 00 is inputted to the RDATA bus. At this time, 5 V is supplied to the power supply line V0 of the memory cell of the address 00, and 3 V is supplied to the power supply lines V1 to V63 of the addresses other than that.

A period 408 is a period in which the data bus RDATA for reading a value of the SRAM is precharged to a HIGH level. In the case of the configuration of the SRAM shown in Embodiment 1, since the memory cell of the SRAM cannot set a data bus to be at a HIGH level, it is necessary to set RE at a LOW level, and precharge by the write/read circuit 101. Accordingly, a value is read from a certain address in the reading period 402, and a period in which RE is at a LOW level is required in the case where data of a different address is read next. In this manner, in a period in which WE is at a LOW level and RE is also at a LOW level, 3 V is supplied to all the power supply lines V0 to V63 supplied to the memory cell of the SRAM. This period is a period of storing the written value.

By the present invention where a voltage of 3 V is supplied in the period of storing a value, and low power consumption of a memory element can be achieved, compared with a conventional memory cell, where a voltage of 5 V is supplied also in the period of storing a value in the memory cell.

Embodiment 3

In the case of the configuration of the power supply control circuit 106 shown in Embodiment 1, power required for an operation of writing or reading is supplied to the SRAM memory at the same timing as performing writing or reading. However, power supply is not made in time in this mode and an operating speed of the SRAM memory is expected to slow. Thus, this embodiment shows a configuration of an SRAM memory for supplying a power supply voltage at timing before the necessary timing.

Figure 5:
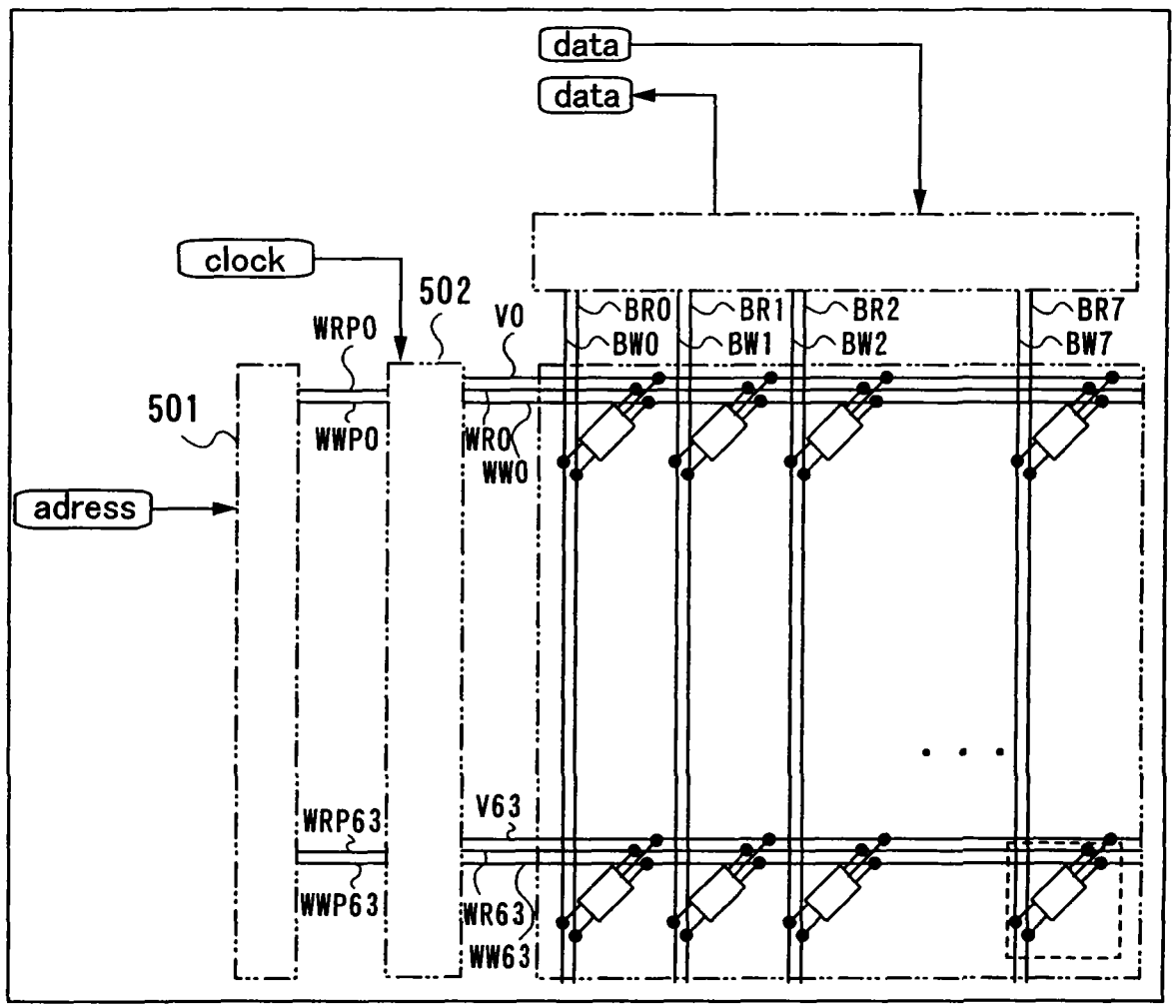
FIG. 5 is a diagram showing a configuration of an SRAM memory of the present invention.

FIG. 5 shows a configuration of an SRAM memory of this embodiment.

In the configuration of the SRAM memory of this embodiment, an address is inputted at one timing before a data bus and the like. An address decoder 501 decodes the address signal input. A power supply control circuit 502 receives the decoded signal from the word line for writing and reading.

Figure 6:
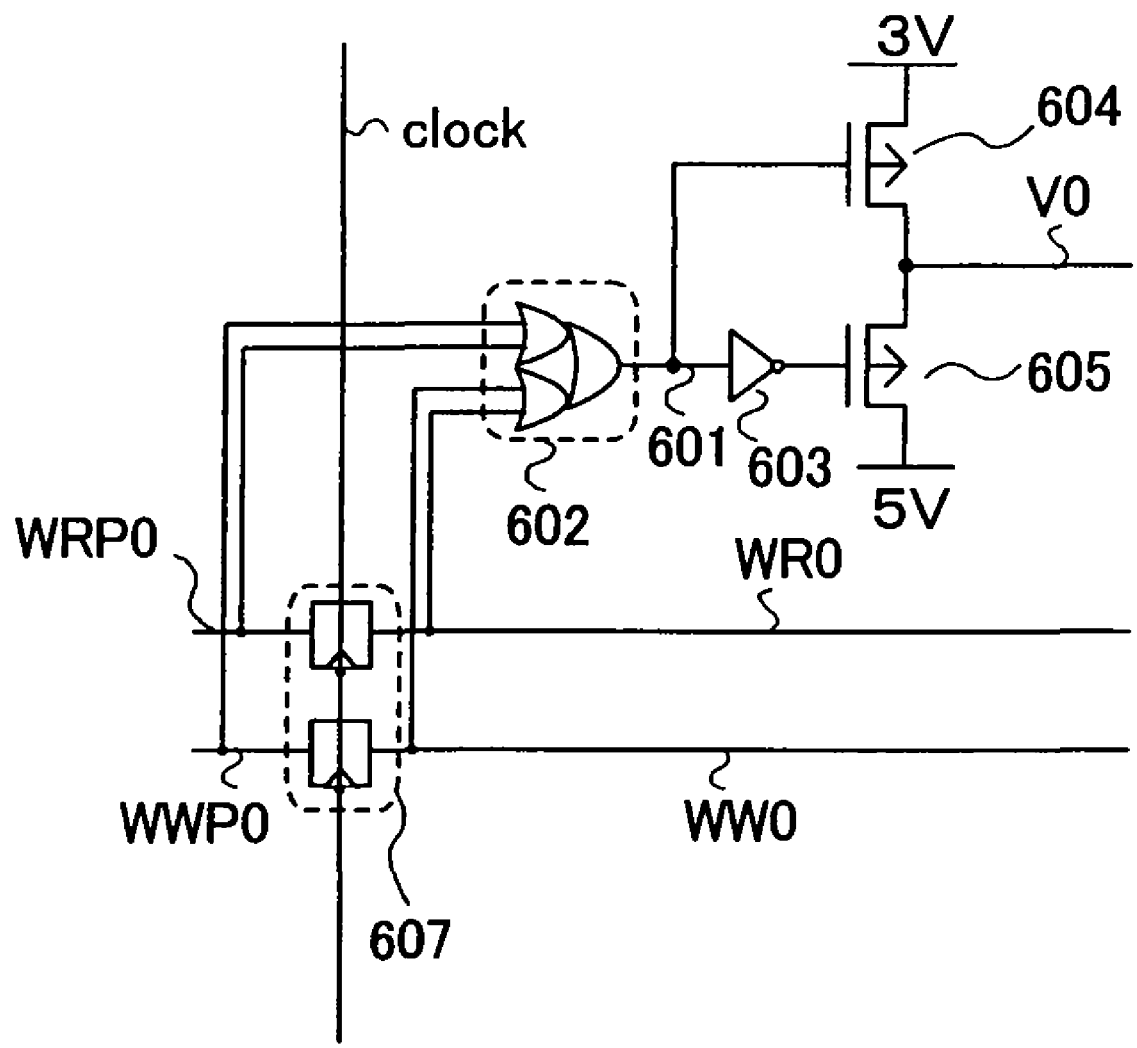
FIG. 6 is a circuit diagram showing a configuration of a power supply control circuit of the present invention.

FIG. 6 shows a configuration of the power supply control circuit 502 in the SRAM memory of this embodiment.

The power supply control circuit 502 includes word lines WWP0 to WWP63 for reading, word lines WRP0 to WRP63 for writing, an OR circuit 602 having four inputs, an inverter circuit 603, P-channel transistors 604 and 605, and a flip-flop 607.

A clock is inputted to the flip-flop 607, and each output terminal thereof and an input terminal of the OR circuit 602 are electrically connected to each other. An output terminal of the OR circuit 602 is electrically connected to an input terminal of the inverter circuit 603 and a gate electrode of the transistor 604. An output terminal of the inverter circuit 603 is electrically connected to a gate electrode of the transistor 605. One of either a source electrode or a drain electrode of the transistor 604 and one of either a source electrode or a drain electrode of the transistor 605 are electrically connected to each other, and electrically connected to the power supply line V0.

A signal is inputted from the decoder 501 to the word lines WWP0 to WWP 63 for writing or the word lines WRP0 to WRP63 for reading, and via the flip-flop 607 in the power supply control circuit 502, and outputted to the word lines WW0 to WW63 for writing or the word lines WR0 to WR63 for reading with one clock delay.

In the case where WWP0 or WRP0 is at a HIGH level, a node 601 is at a HIGH level, and 5 V is supplied to the power supply line V0 of the address 00. In addition, WWP0 and WRP0 are WW0 and WR0 respectively via the flip flop. In the case where WWP0 or WRP0 is at a HIGH level, WW0 and WR0 are at a HIGH level at timing one clock later, and the node 601 is at a HIGH level, so that 5 V is supplied to the power supply line V0 of the address 00. In this manner, a power source of 5 V can be supplied at timing one clock before performing reading and writing. Accordingly, it does not occur that power supply is not made in time and an operating speed of the SRAM memory becomes slow.

Embodiment 4

Figure 7:
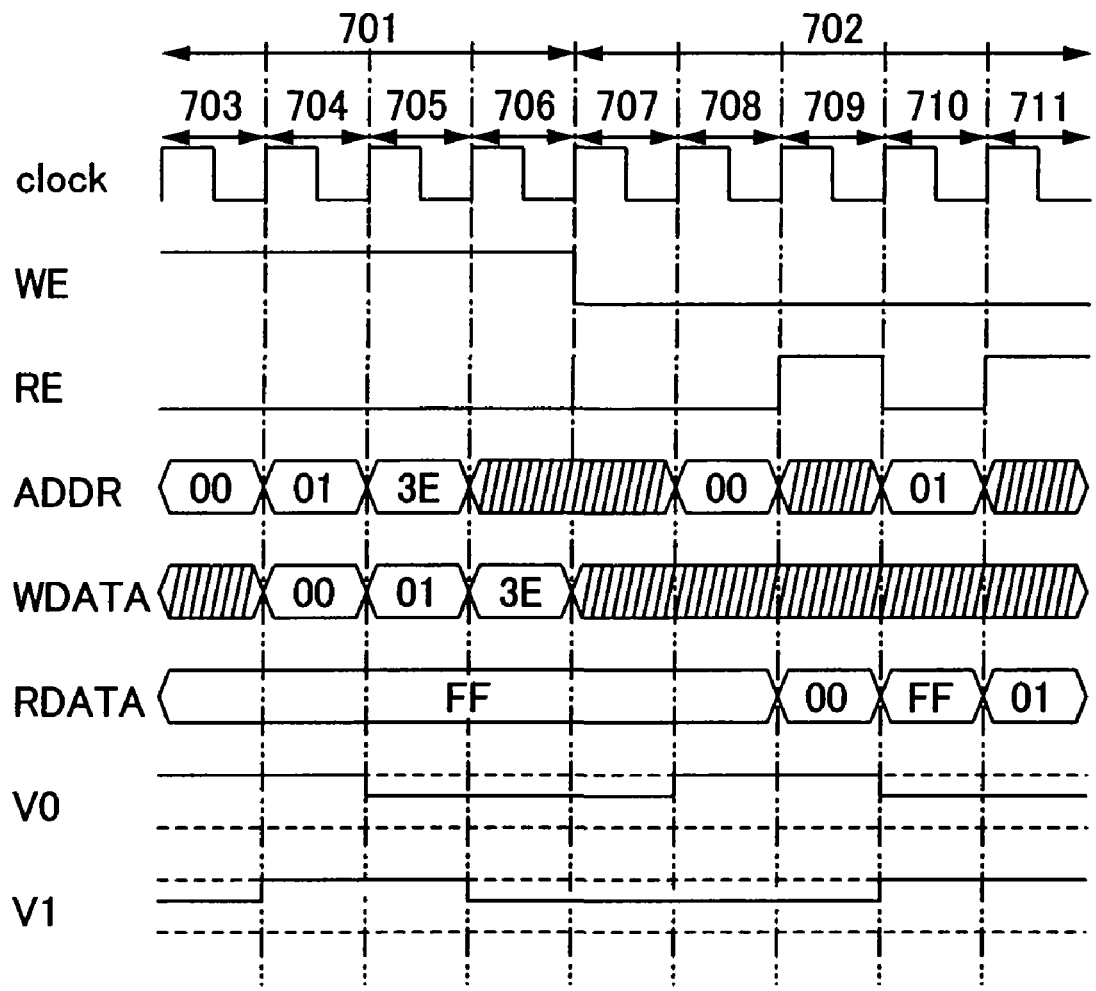
FIG. 7 is a timing chart of a power supply control circuit of the present invention.

In this embodiment, FIG. 7 shows a timing chart of the power supply control circuit 502.

A period 701 is a period of writing, and a period 702 is a period of reading. In a period 703, 00 is inputted to the address bus ADDR, 5 V is supplied to the power supply line V0, and 3 V is supplied to power source lines other than the power supply line V0. In the period 703, WWP0 passes via a flip-flop in the power supply control circuit and the word line WW0 for writing is at a HIGH level in a period 704, so that a value 00 of the WDATA bus is written. In addition, WW0 is at a HIGH level so that 5 V is continuously supplied to the power supply line V0. In addition, 01 is inputted to the address bus ADDR in the period 704, and 5 V is supplied to V1.

In a period 705, 3 V is supplied to the power supply line V0 and 5 V is continuously supplied to V1. In addition, a value 01 of the WDATA bus is written into the address 01.

In a period 708, the RDATA is precharged by the write/read circuit, and 5 V starts to be supplied to the power supply line V0 of the address 00. Even in a period 709, 5 V is continuously supplied to the power supply line V0, and a value 00 of the address 00 is inputted to the RDATA bus. In a period 710, 5 V starts to be supplied to the power supply line V1 of the address 01. In a period 711, 5 V is supplied to V1, and the value 01 of the address 01 is inputted to the RDATA bus.

Embodiment 5

In this embodiment, a configuration example of a top plan view of a memory cell of the present invention and a cross-sectional view thereof is described. Note that a thin film transistor (TFT) is used for a transistor in this embodiment.

Figure 8:
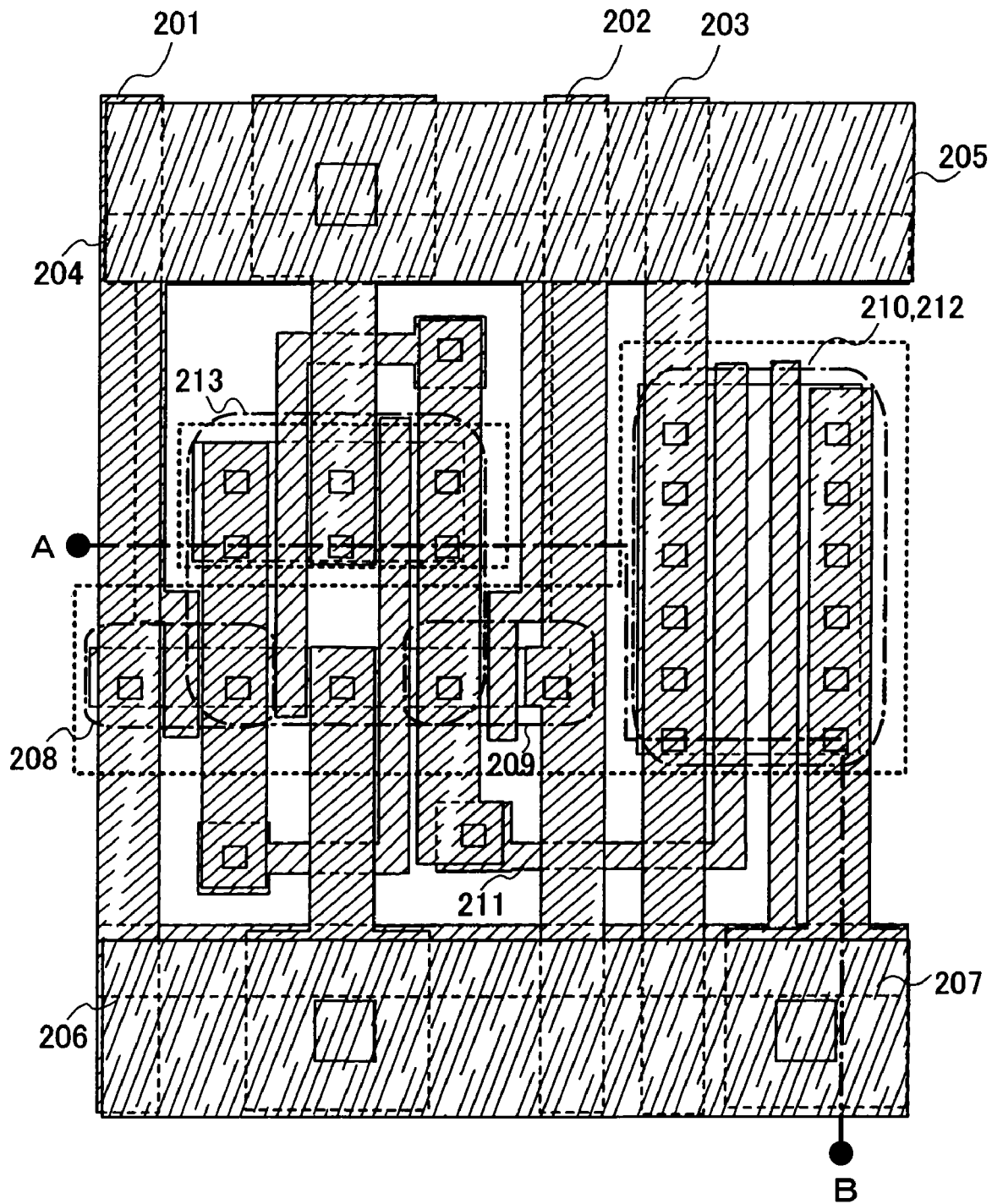
FIG. 8 is a top plan view corresponding to a memory cell of the present invention.

FIG. 8 shows a top plan view of a memory cell corresponding to the circuit diagram of FIG. 2. The memory cell 104 includes the data lines 201 and 202 for writing, the data line 203, the word line 204 for writing, the power supply line 205, the ground line 206, the word line 207 for reading, the N-channel TFTs 208, 209, 210, and 212, the node 211, and the inverter circuit 213. The N-channel TFTs 208 and 209 are formed of the same semiconductor layer, the N-channel TFTs 210 and 212 are formed of the same semiconductor layer, and the P-channel TFTs included in the inverter circuit 213 are formed of the same semiconductor layer. The N-channel TFTs 210 and 212 are provided so as to have a wider channel width. Since the read line 203 has large capacitance, a transistor with a wide channel width is preferably provided so as to reduce a voltage of the read line 203 to 0 V at a predetermined operating speed. In addition, the P-channel TFTs in the inverter circuit 213 are provided so as to have a wider channel width than that of an N-channel TFT. This is because a mobility of the P-channel TFT is increased.

A gate electrode and a gate wiring are provided over these semiconductor layers. The N-channel TFTs 210 and 212 are connected in series. One of the gate electrodes of the TFTs 210 and 212 is connected to the node 211, and the other gate electrode is connected to the word line 207. A gate electrode of the N-channel TFT and a gate electrode of the P-channel TFT in the inverter circuit 213 are electrically connected to each other; therefore, a common gate electrode is formed.

A source electrode, a drain electrode, and a wiring are provided over the gate electrode and the semiconductor layer. Line widths of the source electrode, the drain electrode, and the wiring are provided wider than line widths of the gate electrode and the gate wiring. The word line 204 and the power supply line 205 are provided to interpose the inverter circuit 213 therebetween. In order to connect the source electrode, the drain electrode, and the wiring with the semiconductor layer or the gate wiring and the like, an insulating layer which is provided between them is provided with contact holes (shown by squares). By increasing the number of contact holes or increasing an area thereof, a contact defect can be reduced.

A wiring is provided over the source electrode, the drain electrode, and the wiring. The wirings serve as the ground line 206 and the word line 207, and is provided so as to have a wider line width than that of the source electrode, the drain electrode, and the wiring. By the ground line 206 and the word line 207 which have a wider line width, voltage drop can be suppressed. In order to connect the wiring with the gate wiring or the wiring, an insulating layer which is provided between them is provided with contact holes (shown by squares).

Next, description is made of a manufacturing process of a memory cell with reference to a cross-sectional view taken along a line A-B in FIG. 8.

Figure 9A:
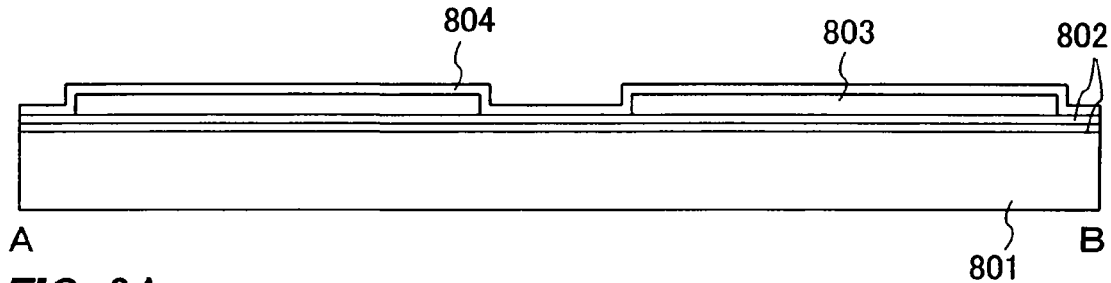
FIGS. 9A to 9D are cross-sectional views corresponding to a memory cell of the present invention.

In FIG. 9A, a substrate (insulating substrate) 801 having an insulating surface is prepared. The insulating substrate is a glass substrate, a quartz substrate, a plastic substrate, or the like. Such a substrate can be formed to be thin by a method of polishing a rear surface of the substrate or another method. Moreover, it is possible to use a conductive substrate made of a metal element or the like or a semiconductor substrate made of silicon or the like, over which a layer formed with an insulating material is provided. By forming a memory cell over a plastic substrate for example, a lightweight, thin, and highly flexible device can be manufactured.

A base layer 802 is formed over the insulating substrate 801. The base layer 802 can be formed with a single-layer or stacked structure by using an insulating material such as silicon oxide, silicon nitride, or silicon oxynitride. In this embodiment, the base layer 802 has a two-layer structure. As a first layer of the base layer 802, a silicon oxynitride layer having a thickness of 10 to 200 nm (preferably 50 to 100 nm) is formed. The silicon oxynitride layer can be formed by a plasma CVD method using $SiH_4$, $NH_3$, $N_2O$, and $H_2$ as reactive gas. Next, as a second layer of the base layer 802, a silicon oxynitride layer having a thickness of 50 to 200 nm (preferably 100 to 150 nm) is formed. The silicon oxynitride layer can be formed by a plasma CVD method using $SiH_4$ and $N_2O$ as reactive gas.

A semiconductor layer is formed over the base layer 802. The semiconductor layer can be formed of a material containing silicon. The semiconductor layer can be formed to have any of an amorphous state, a crystalline state, or a microcrystalline state. When the semiconductor layer is formed to have a crystalline state, the mobility of a TFT can be increased, which is preferable.

There is a method for performing heat treatment to an amorphous semiconductor layer so as to form a semiconductor layer with a crystalline state. Laser irradiation, a heating furnace, lamp radiation, or the like is used for the heat treatment, and any one or more of them can be used.

The laser irradiation can be carried out by using a continuous wave laser beam (CW laser beam) or a pulsed laser beam (pulsed laser beam). As the laser beam, a beam emitted from one or more kinds of a gas laser such as an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used. By delivering a fundamental wave of such a laser beam or any one of second to fourth harmonics of the fundamental wave, a silicon layer having a crystal with large grain size can be obtained. As the harmonic, a second harmonic (532 nm) or a third harmonic (355 nm) of an $Nd:YVO_4$ laser (fundamental wave: 1064 nm) can be used. At this time, an energy density of the laser irradiation of about 0.01 to 100 $MW/cm^2$ (preferably 0.1 to 10 $MW/cm^2$) is needed. The scan speed is set to about 10 to 2000 cm/s to irradiate the semiconductor layer.

Note that a CW laser beam with a fundamental wave and a CW laser beam with a harmonic may be delivered, or a CW laser beam with a fundamental wave and a pulsed laser beam with a harmonic may be delivered. By delivering a plurality of laser beams, an energy region of a wide range can be covered.

Moreover, it is also possible to use a pulsed laser beam emitted with a repetition rate that is set so that a pulsed laser beam can be delivered before a silicon layer having an amorphous state is melted by the previous laser beam and after the melted silicon layer is solidified. By emitting a laser beam with such repetition rate, it is possible to obtain a silicon layer having crystal grains grown continuously toward a scan direction. The repetition rate of such a laser beam is 10 MHz or higher, which is much higher than a repetition rate used in general ranging from several ten to several hundred Hz.

If a heating furnace is used for the heat treatment, the semiconductor layer having an amorphous state is heated at 400 to 550° C. for 2 to 20 hours. At this time, the temperature is set at multiple stages in the range of 400 to 550° C. so that the temperature gradually gets higher. Since hydrogen and the like contained in the semiconductor layer having an amorphous state are released by an initial low-temperature heat process at about 400° C., it is possible to reduce roughness of a surface of the layer at crystallization.

In the above heat treatment process, a metal element for promoting crystallization of a semiconductor layer, for example nickel (Ni), is added. For example, a solution containing nickel is applied onto the silicon layer having an amorphous state and then heat treatment is carried out. By conducting heat treatment using the metal, heat temperature can be decreased, and moreover a polycrystalline silicon layer having continuous crystal grain boundaries can be obtained. Here, as the metal for promoting the crystallization, iron (Fe), ruthenium (Ru), rhodium (Rh), palladium (Pd), osmium (Os), iridium (Ir), platinum (Pt), copper (Cu), silver (Ag), or the like can also be used besides Ni.

Since a metal for promoting crystallization becomes a contaminant source for a memory or the like, it is desirable that a gettering step be carried out to remove the metal after crystallizing the semiconductor layer. In the gettering step, after crystallizing the semiconductor layer, a layer serving as a gettering sink is formed over the semiconductor layer, and the metal is moved to the gettering sink through heat treatment. As the gettering sink, a polycrystalline semiconductor layer or a semiconductor layer added with an impurity can be used. For example, a polycrystalline semiconductor layer obtained by adding an inert element such as argon onto a polycrystalline silicon layer is formed, and this polycrystalline semiconductor layer can be used as a gettering sink. By adding the inert element to the gettering sink, the polycrystalline semiconductor layer is distorted, thereby gettering the metal more efficiently. Moreover, by adding an element such as phosphorus into a portion of a polycrystalline semiconductor layer of a TFT, the metal can be gettered without forming another gettering sink.

The semiconductor layer formed in this manner is processed into a predetermined shape to form an island-shaped semiconductor layer 803. As a method for such processing, etching using a mask formed by a photolithography method is performed. Either a wet etching method or a dry etching method can be applied to etching.

An insulating layer which functions as a gate insulating layer 804 is formed so as to cover the semiconductor layer 803. The gate insulating layer 804 can be formed of a similar material and method to that of the base layer 802.

Figure 9B:
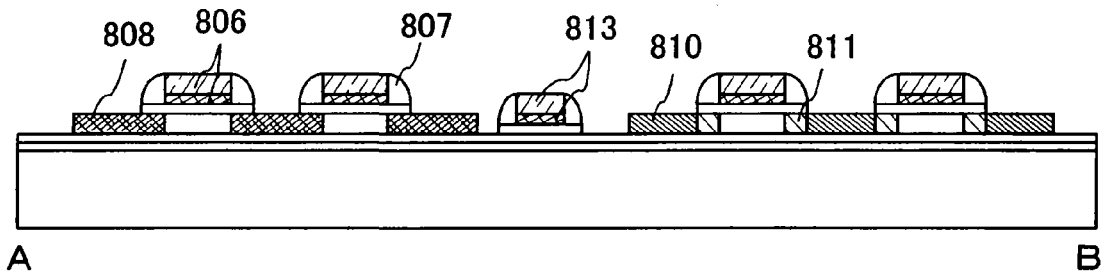

As shown in FIG. 9B, a conductive layer functioning as a gate electrode and a gate wiring is formed over the gate insulating layer 804. A film made of an element such as aluminum (Al), titanium (Ti), molybdenum (Mo), tantalum (Ta), tungsten (W), or silicon (Si), or an alloy film containing these elements can be used for the conductive layer. The conductive layer can have either a single-layer structure or a stacked structure, and a stacked structure of tantalum nitride and tungsten can be used as a stacked structure. The conductive layer is processed into a predetermined shape, and a gate electrode 806 and a gate wiring 813 which have a stacked structure can be formed. As a method for such processing, etching using a mask formed by a photolithography method is performed. Either a wet etching method or a dry etching method can be applied to etching.

On the side surface of the gate electrodes 806, an insulator called a side wall 807 is formed. The side wall 807 can be formed of a similar material and method to that of the base layer 802. In addition, isotropic etching may be used in order to form a taper shape at an end portion of the side wall 807. Due to the side wall, a short channel effect which is generated as a gate length becomes narrow can be prevented. Since the short channel effect is significant in an N-channel TFT, a side wall is preferably provided at least on a side of a gate electrode of the N-channel TFT. Similarly, a gate wiring may be provided with a side wall.

In this state, by using the gate electrode 806 and the side wall 807, an impurity element is added into the semiconductor layer 803. In the case of forming an N-channel TFT, phosphorus (P) can be used as the impurity element, while in the case of forming a P-channel TFT, boron (B) can be used as the impurity element. When the impurity element is added, an impurity region is formed in the semiconductor layer 803. In the impurity region, high concentration impurity regions 808 and 810, and a low concentration impurity region 811 located below the side wall 807 are formed.

After the impurity is added, heat treatment is performed if necessary, so that activation of the impurity element and improvement of a surface of the semiconductor layer can be achieved. A technique similar to crystallization can be used for heat treatment.

Figure 9C:
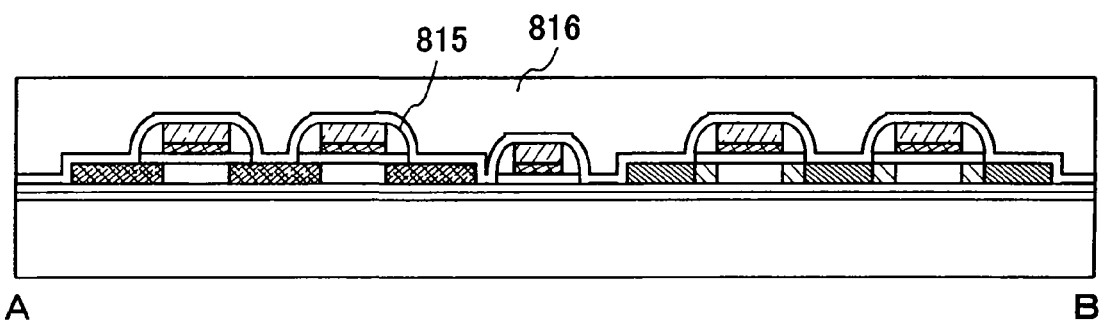

As shown in FIG. 9C, insulating layers 815 and 816 functioning as interlayer films are formed by covering the semiconductor layer and the gate electrode. The interlayer films can have a single-layer structure or a stacked structure. A stacked structure is shown in this embodiment. An inorganic material or an organic material can be used for the interlayer films. Silicone oxide, silicon nitride, silicon oxynitride, or the like can be used for the inorganic material. Polyimide, acrylic, polyamide, polyimide amide, resist, benzocyclobutene, siloxane, or polysilazane can be used for the organic material. Note that siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. As a further alternative, a fluoro group and an organic group containing at least hydrogen may be used as the substituent. Polysilazane is formed by using a polymer material having the bond of silicon (Si) and nitrogen (N) as a starting material. Intrusion of an impurity element can be prevented by using an inorganic material, and planarity can be improved by using an organic material. Therefore, in this embodiment, an inorganic material is used for the insulating layer 815 and an organic material is used for the insulating layer 816.

Figure 9D:
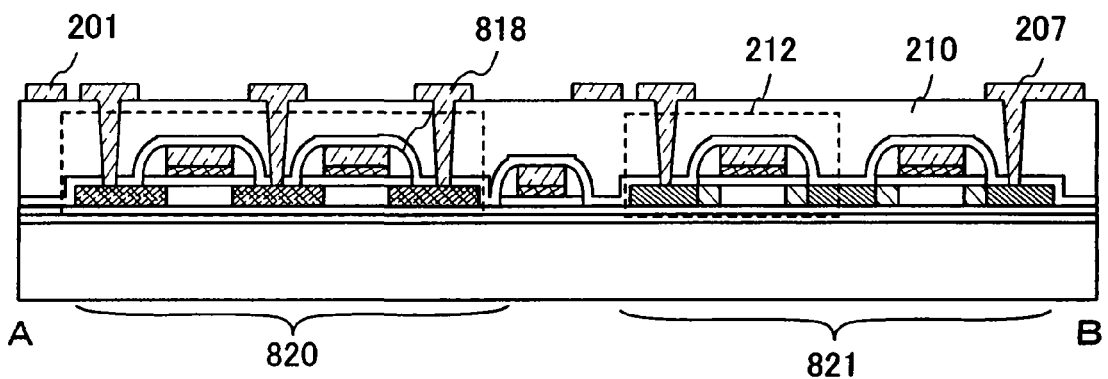

As shown in FIG. 9D, a contact hole, which penetrates the insulating layers 816 and 815, is formed, and a wiring 818 is formed so as to fill the contact hole. The wiring 818 can be formed by using a film made of an element such as an aluminum (Al), titanium (Ti), molybdenum (Mo), tantalum (Ta), tungsten (W) or silicon (Si), or an alloy film containing such elements. The wiring 818 can be formed to have either a single-layer structure or a stacked structure. For example, a structure, in which a first layer formed of tungsten, tungsten nitride, or the like, a second layer formed of an alloy of aluminum and silicon (Al—Si) or an alloy of aluminum and titanium (Al—Ti), and a third layer formed by sequentially stacking a titanium nitride film, a titanium film, or the like, can be used. For processing the wiring 818, there is an etching method using a mask formed by a photolithography method. Either a wet etching method or a dry etching method can be applied to the etching method. The wiring 818 is connected to the impurity region in the semiconductor layer 803, and such a wiring can be called a source electrode or a drain electrode.

In this manner, a P-channel TFT 820 and an N-channel TFT 821 can be formed. Note that the N-channel TFT 821 corresponds to the transistors 210 and 212, and a portion of the wiring 818 corresponds to the data line 201 and the word line 207.

In this manner, a memory cell of the present invention can be formed by using the TFTs over the insulating substrate. Needless to say, a memory cell of the present invention is not limited to this, and includes a transistor using a silicon wafer. However, by forming the TFT over the insulating substrate, an inexpensive memory cell and a device including the memory cell can be provided.

Embodiment 6

Figure 10:
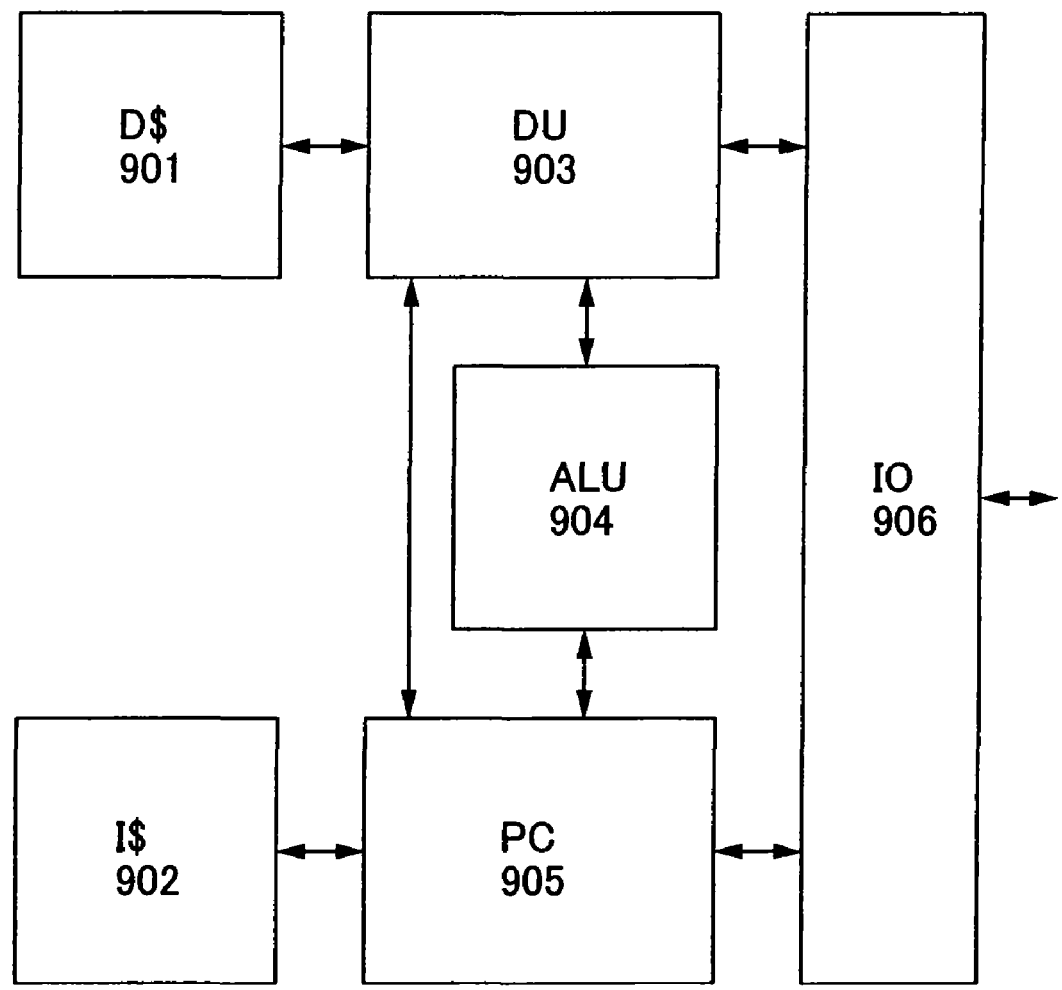
FIG. 10 is a block diagram showing a CPU on which an SRAM memory of the present invention can be mounted.

The SRAM of the present invention can be applied to a CPU. In this embodiment, description is made of a configuration of a CPU on which the SRAM of the present invention is mounted. FIG. 10 shows a simple configuration of the CPU.

The CPU includes a D$ (Data Cache) block 901, an I$ (Instruction Cache) block 902, a DU (Data Unit) block 903, an ALU (Arithmetic Logic Unit) block 904, a PC (Program Counter) block 905, and an 10 (InOut) block 906.

The D$ 901 has a function of temporarily storing address data which has been recently accessed so as to access the address data at high-speed. The I$ 902 has a function of temporarily storing an address instruction which has been recently accessed so as to access the address instruction at high-speed. The DU 903 has a function of determining whether to access the D$ 901 or the IO 906 when a store or load instruction is executed. The ALU 904 is an arithmetic logic unit and has a function of performing four rules of arithmetic, a comparison operation, a logic operation, or the like. The PC 905 has a function of storing an instruction address which is currently in execution and fetching a next instruction after the instruction is completed. In addition, the PC 905 has a function of determining whether to access the I$ or the IO when the next instruction is fetched. The IO 906 has a function of receiving an access from the DU or the PC, and transmitting/receiving data to/from the outside. Each relationship is described below.

When the PC 905 fetches an instruction, the I$ 902 is accessed first, and the IO 906 is accessed in the case where there is no corresponding address instruction in the I$ 902. Accordingly, an obtained instruction is stored in the I$ 902 and executed. The ALU 904 implements an operation in the case where the instruction to be executed is an arithmetic logic operation. The DU 903 implements an operation in the case where the instruction to be executed is a store or load instruction. At this time, the DU 903 accesses the D$ 901 first, and accesses the IO 906 in the case where there is no corresponding address data in the D$ 901.

In such a CPU, the SRAM of the present invention can be applied to the D$ 901, the I$ 902, and a GPR in the ALU 904. Accordingly, a CPU which achieves low power consumption can be provided.

Embodiment 7

As a semiconductor device on which the SRAM of the present invention is mounted, a video camera, a digital camera, a goggle type display (head mount display), a navigation system, an audio reproducing device (such as a car stereo or an audio component), a notebook personal computer, a game machine, a mobile information terminal (such as a mobile computer, a mobile phone, a mobile game machine, or an electronic book), an image reproducing device equipped with a recording medium (specifically, a device for reproducing a recording medium such as a DVD (Digital Versatile Disc) and including a display for displaying the replaced image), and the like are given as examples. FIGS. 11A to 11E show specific examples of the semiconductor devices.

Figure 11A:
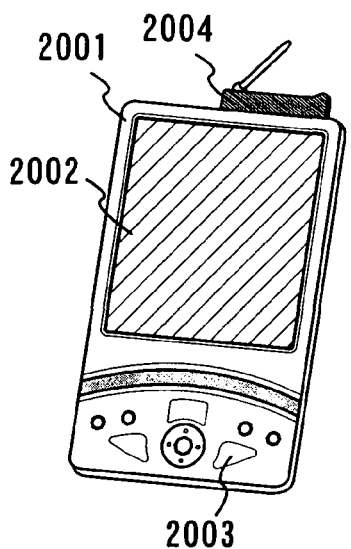
FIGS. 11A to 11E are views each showing an electronic apparatus of the present invention.

FIG. 11A is a mobile information terminal (so-called PDA: Personal Digital Assistant), which includes a main body 2001, a display portion 2002, an operation key 2003, a modem 2004, and the like, and the SRAM memory of the present invention is provided as a memory element included in the main body 2001. By the SRAM memory of the present invention, low cost of the mobile information terminal can be achieved.

Figure 11B:
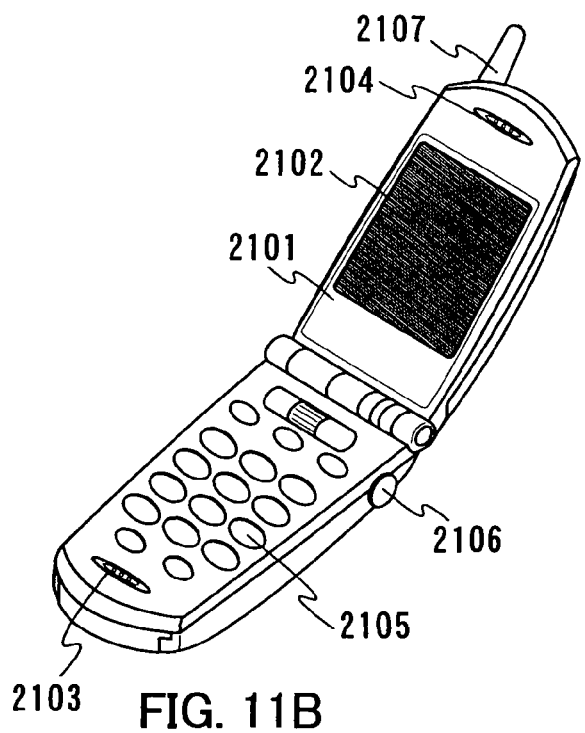

FIG. 11B is a mobile phone device which includes a main body 2101, a display portion 2102, a sound input portion 2103, a sound output portion 2104, an operation key 2105, an external connecting port 2106, an antenna 2107, and the like, and the SRAM memory of the present invention is provided as a memory element included in the main body 2101. By the SRAM memory of the present invention, low cost of the mobile phone device can be achieved.

Figure 11C:
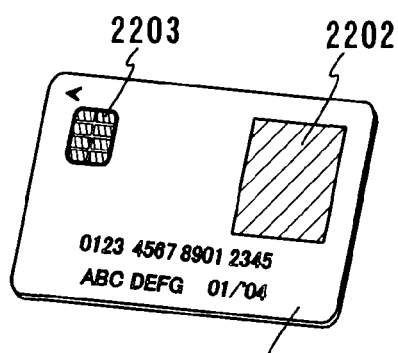

FIG. 11C is an electronic card which includes a main body 2201, a display portion 2202, a connecting terminal 2203, and the like, and the SRAM memory of the present invention is provided as a memory element included in the main body 2201. By the SRAM memory of the present invention, low cost of the electronic card can be achieved. Note that FIG. 11C shows a contact-type electronic card; however, the SRAM memory of the present invention can be used for a noncontact-type electronic card or an electronic card having a contact function and a noncontact function.

Figure 11D:
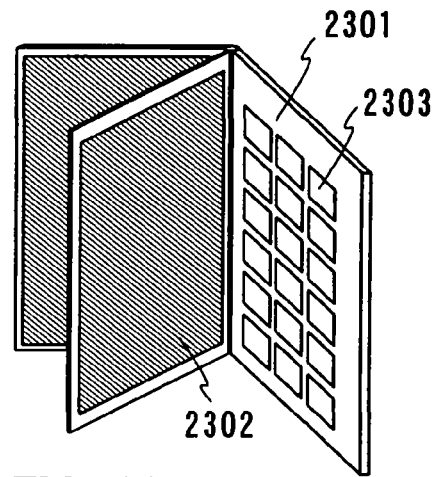

FIG. 11D is an electronic book which includes a main body 2301, a display portion 2302, an operation key 2303, and the like, and the SRAM memory of the present invention is provided as a memory element included in the main body 2301. In addition, a modem may be incorporated in the main body 2301 of the electronic book. By the SRAM memory of the present invention, low cost of the electronic book can be achieved.

Figure 11E:
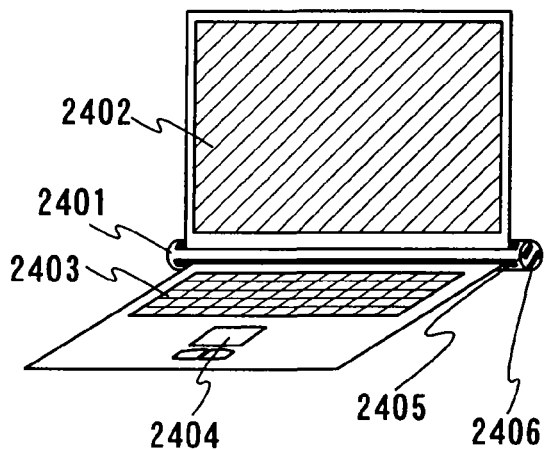

FIG. 11E is a computer which includes a main body 2401, a display portion 2402, a keyboard 2403, a touchpad 2404, an external connecting port 2405, a plug for power supply 2406, and the like, and the SRAM memory of the present invention is provided as a memory element included in the main body 2401. By the SRAM memory of the present invention, low cost of the computer can be achieved.

As set forth above, the present invention is used in an extremely wide range of application, and can be used as semiconductor devices in various fields. Note that the semiconductor device of this embodiment can be combined with any structure shown in embodiment mode, embodiments, and the method for manufacturing the same.

This application is based on Japanese Patent Application Ser. No. 2005-220530 filed in Japan Patent Office on Jul. 29, 2005, the entire contents of which are hereby incorporated by reference.

What is claimed is:

1. A semiconductor device comprising a power supply control circuit, and a memory cell,
    wherein the power supply control circuit comprises:
        a first word line;
        a second word line;
        a circuit comprising one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals;
        a first inverter circuit comprising an input terminal electrically connected to the output terminal of the circuit; and
        means for supplying a first voltage or a second voltage lower than the first voltage to the memory cell, the means being electrically connected to the circuit and the first inverter circuit,
    wherein the memory cell comprises a second inverter circuit, and is electrically connected to the first word line and the second word line.

2. A semiconductor device according to claim 1, wherein the means for supplying the first voltage or the second voltage lower than the first voltage to the memory cell comprises two transistors.

3. A semiconductor device according to claim 1, wherein the circuit which comprises two input terminals and one output terminal in which a HIGH level is outputted to the output terminal when a HIGH level is inputted to either one of the input terminals, and a LOW level is outputted to the output terminal when a LOW level is inputted to both of the input terminals, comprises either of an OR circuit, a circuit comprising a NOR circuit and an inverter circuit, or a circuit comprising two inverter circuits and a NAND circuit.

4. A semiconductor device comprising a power supply control circuit, and a memory cell,
    wherein the power supply control circuit comprises:
        a first word line;
        a second word line;
        a circuit comprising one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals;
        a first inverter circuit comprising an input terminal electrically connected to the output terminal of the circuit; and
        means for supplying a first voltage or a second voltage lower than the first voltage to the memory cell, the means being electrically connected to the circuit and the first inverter circuit,
    wherein the memory cell comprises a second inverter circuit electrically connected to a ground line and a power supply line, and is electrically connected to the first word line and the second word line.

5. A semiconductor device according to claim 4, wherein the means for supplying the first voltage or the second voltage lower than the first voltage to the memory cell comprises two transistors.

6. A semiconductor device according to claim 4, wherein the circuit which comprises two input terminals and one output terminal in which a HIGH level is outputted to the output terminal when a HIGH level is inputted to either one of the input terminals, and a LOW level is outputted to the output terminal when a LOW level is inputted to both of the input terminals, comprises either of an OR circuit, a circuit comprising a NOR circuit and an inverter circuit, or a circuit comprising two inverter circuits and a NAND circuit.

7. A semiconductor device comprising a power supply control circuit, and a memory cell,
wherein the power supply control circuit comprises:
a first word line;
a second word line;
a circuit comprising one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals;
a first inverter circuit comprising an input terminal electrically connected to the output terminal of the circuit; and
means for supplying a first voltage or a second voltage lower than the first voltage to the memory cell, the means being electrically connected to the circuit and the first inverter circuit,
wherein the memory cell is electrically connected to the first word line and the second word line, and comprises a second inverter circuit electrically connected to a ground line and a power supply line, and a transistor electrically connected to the second inverter circuit; and
wherein a gate electrode of the transistor is electrically connected to the first word line.

8. A semiconductor device according to claim 7, wherein the means for supplying the first voltage or the second voltage lower than the first voltage to the memory cell comprises two transistors.

9. A semiconductor device according to claim 7, wherein the circuit which comprises two input terminals and one output terminal in which a HIGH level is outputted to the output terminal when a HIGH level is inputted to either one of the input terminals, and a LOW level is outputted to the output terminal when a LOW level is inputted to both of the input terminals, comprises either of an OR circuit, a circuit comprising a NOR circuit and an inverter circuit, or a circuit comprising two inverter circuits and a NAND circuit.

10. A semiconductor device according to claim 7, wherein the transistor is a thin film transistor formed over an insulating substrate.

11. A semiconductor device according to claim 7, wherein the first word line and the power supply line are formed of the same material as the gate electrode of the transistor.

12. A semiconductor device comprising a power supply control circuit, and a memory cell,
wherein the power supply control circuit comprises:
a first word line;
a second word line;
a circuit comprising one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals;
a first inverter circuit comprising an input terminal electrically connected to the output terminal of the circuit; and
means for supplying a first voltage or a second voltage lower than the first voltage to the memory cell, the means being electrically connected to the circuit and the first inverter circuit,
wherein the memory cell is electrically connected to the first word line and the second word line, and comprises a second inverter circuit electrically connected to a ground line and a power supply line, and first to third transistors each electrically connected to the second inverter circuit, and
wherein a gate electrode of the first transistor is electrically connected to the first word line, one of either a source electrode or a drain electrode of each of the second transistor and the third transistor is electrically connected to a data line, and gate electrodes of the second transistor and the third transistor are electrically connected to the second word line.

13. A semiconductor device according to claim 12, wherein the data line is provided in the same layer as the source electrode and the drain electrode of the transistor.

14. A semiconductor device according to claim 12, wherein the means for supplying the first voltage or the second voltage lower than the first voltage to the memory cell comprises two transistors.

15. A semiconductor device according to claim 12, wherein the circuit which comprises two input terminals and one output terminal in which a HIGH level is outputted to the output terminal when a HIGH level is inputted to either one of the input terminals, and a LOW level is outputted to the output terminal when a LOW level is inputted to both of the input terminals, comprises either of an OR circuit, a circuit comprising a NOR circuit and an inverter circuit, or a circuit comprising two inverter circuits and a NAND circuit.

16. A semiconductor device according to claim 12, wherein the transistor is a thin film transistor formed over an insulating substrate.

17. A semiconductor device according to claim 12, wherein the first word line and the power supply line are formed of the same material as the gate electrode of the transistor.

18. A method for driving a semiconductor device,
wherein the semiconductor device comprises:
a memory cell electrically connected to a first word line and a second word line and comprising a first inverter circuit; and
a power supply control circuit comprising:
the first word line;
the second word line;
a circuit comprising one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals;

a second inverter circuit comprising an input terminal electrically connected to the output terminal of the circuit;

a first transistor comprising a gate electrode electrically connected to an output terminal of the second inverter circuit;

a second transistor electrically connected to the output terminal of the circuit; and a power supply line electrically connected to the first transistor and the second transistor, wherein the first word line is at a HIGH level and the second word line is at a LOW level, so that the first transistor is turned ON, and a first voltage is supplied to the power supply line in a period of writing a value into the memory cell, and wherein the first word line and the second word line are at a LOW level, so that the second transistor is turned ON, and a second voltage lower than the first voltage is supplied to the power supply line in a period of storing the value written into the memory cell.

19. A method for driving a semiconductor device, wherein the semiconductor device comprises:

a memory cell which comprises a first inverter circuit electrically connected to a ground line and a power supply line, and is electrically connected to a first word line and a second word line; and a power supply control circuit comprising:

the first word line;

the second word line;

a circuit comprising one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals;

a second inverter circuit comprising an input terminal electrically connected to the output terminal of the circuit; and means for supplying a first voltage or a second voltage lower than the first voltage to the memory cell, the means being electrically connected to the circuit and the second inverter circuit, wherein the first word line is at a HIGH level and the second word line is at a LOW level, so that the first transistor is turned ON, and the first voltage is supplied to the power supply line in a period of writing a value into the memory cell, and wherein the first word line and the second word line are at a LOW level, so that the second transistor is turned ON, and the second voltage lower than the first voltage is supplied to the power supply line in a period of storing the value written into the memory cell.

20. A method for driving a semiconductor device, wherein the semiconductor device comprises:

a memory cell electrically connected to a first word line and a second word line and comprising a first inverter circuit; and a power supply control circuit comprising:

the first word line;

the second word line;

a circuit comprising one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals;

a second inverter circuit comprising an input terminal electrically connected to the output terminal of the circuit;

a first transistor comprising a gate electrode electrically connected to an output terminal of the second inverter circuit;

a second transistor electrically connected to the output terminal of the circuit; and a power supply line electrically connected to the first transistor and the second transistor, wherein the first word line is at a HIGH level and the second word line is at a LOW level, so that the first transistor is turned ON, and a first voltage is supplied to the power supply line electrically connected to the first transistor in a period of writing a value into the memory cell, wherein the first word line and the second word line are at a LOW level, so that the second transistor is turned ON, and a second voltage lower than the first voltage is supplied to the power supply line in a period of storing the value written into the memory cell, and wherein the first word line is at a LOW level and the second word line is at a HIGH level, so that the first transistor is turned ON, and the first voltage is supplied to the power supply line electrically connected to the first transistor in a period of reading the value written into the memory cell.

21. A method for driving a semiconductor device, wherein the semiconductor device comprises:

a memory cell which comprises a first inverter circuit electrically connected to a ground line and a power supply line, and is electrically connected to a first word line and a second word line; and a power supply control circuit comprising:

the first word line;

the second word line;

a circuit comprising one output terminal, and two input terminals, one of which is electrically connected to the first word line and the other of which is electrically connected to the second word line, in which a HIGH level is outputted to the output terminal when a HIGH level is inputted to either one of the input terminals, and a LOW level is outputted to the output terminal when a LOW level is inputted to both of the input terminals;

a second inverter circuit comprising an input terminal electrically connected to the output terminal of the circuit; and means for supplying a first voltage or a second voltage lower than the first voltage to the memory cell, the means being electrically connected to the circuit and the second inverter circuit, wherein the first word line is at a HIGH level and the second word line is at a LOW level, so that the first transistor is turned ON, and the first voltage is supplied to the power supply line electrically connected to the first transistor in a period of writing a value into the memory cell, wherein the first word line and the second word line are at a LOW level, so that the second transistor is turned ON, and the second voltage lower than the first voltage is supplied to the power supply line in a period of storing the value written into the memory cell, and wherein the first word line is at a LOW level and the second word line is at a HIGH level, so that the first transistor is turned ON, and the first voltage is supplied to the power supply line electrically connected to the first transistor in a period of reading the value written into the memory cell.

22. A semiconductor device comprising a power supply control circuit, and a memory cell, wherein the power supply control circuit comprises:

at least a first word line and a second word line;

two input terminals, one of which is electrically connected to the first word line and the other of which is electrically connected to the second word line; and a output terminal which is selectively connectable to one of a first voltage source and a second voltage source in accordance with input levels of the first word line and the second word line, wherein the memory cell are electrically connected to the first word line, the second word line and the output terminal.

23. A semiconductor device according to claim 22, wherein a second voltage supplied from the second voltage source is lower than a first voltage supplied from the first voltage source.

24. A semiconductor device according to claim 22, wherein the power supply control circuit comprises at least one of an OR circuit, a NOR circuit, an inverter circuit, and a NAND circuit.

* * * * *